(12) United States Patent
Sun et al.

(10) Patent No.: US 9,048,404 B2
(45) Date of Patent: Jun. 2, 2015

(54) THIN FLAT SOLID STATE LIGHT SOURCE MODULE

(76) Inventors: Zhuo Sun, Shanghai (CN); Yi Sun, Wellesley, MA (US)

(*) Notice: Subject to any disclaimer, the term of this patent is extended or adjusted under 35 U.S.C. 154(b) by 1287 days.

(21) Appl. No.: 12/711,223

(22) Filed: Feb. 23, 2010

(65) Prior Publication Data

US 2011/0001148 A1    Jan. 6, 2011

Related U.S. Application Data

(60) Provisional application No. 61/270,180, filed on Jul. 6, 2009.

(51) Int. Cl.
*H01L 33/60*   (2010.01)
*H01L 25/075*  (2006.01)
*H01L 33/50*   (2010.01)
*H01L 33/64*   (2010.01)

(52) U.S. Cl.
CPC ............. *H01L 33/60* (2013.01); *H01L 25/0753* (2013.01); *H01L 33/507* (2013.01); *H01L 33/508* (2013.01); *H01L 33/641* (2013.01); *H01L 2933/0091* (2013.01); *H01L 2224/48091* (2013.01); *H01L 2224/73265* (2013.01); *H01L 2224/45124* (2013.01)

(58) Field of Classification Search
CPC .................. H01L 33/60; H01L 2224/48091
See application file for complete search history.

(56) References Cited

U.S. PATENT DOCUMENTS

| | | | |
|---|---|---|---|
| 7,116,485 B2 | 10/2006 | Po-Hung | |
| 7,259,403 B2 | 8/2007 | Shimizu | |
| 2009/0010009 A1 | 1/2009 | Yang | |
| 2009/0026484 A1 * | 1/2009 | Hsu et al. | 257/99 |
| 2010/0320479 A1 * | 12/2010 | Minato et al. | 257/88 |

FOREIGN PATENT DOCUMENTS

WO    WO 2009069671 A1 *  6/2009

* cited by examiner

*Primary Examiner* — Matthew Reames
(74) *Attorney, Agent, or Firm* — Jien Tan; JT Law Services, PC (57) ABSTRACT

Thin, flat solid state light source device and methods for manufacturing is described. LED chips and their circuit boards are mounted on a thermal conductive substrate. The LED chips are surrounded with a flat layer of reflecting material which may embed the circuit boards. The LED chips and the reflecting layer is then topped with a layer of diffusion material and a layer of cover material.

34 Claims, 5 Drawing Sheets

THIN FLAT SOLID STATE LIGHT SOURCE MODULE

CROSS REFERENCE TO RELATED APPLICATION

Priority is claimed from the U.S. Provisional Application 61/270,180 filed on Jul. 6, 2009, entirety of which is hereby incorporated by reference.

BACKGROUND

The present application relates to light emitting diode device (LED), and more particularly to thin flat solid state lighting that is cost effective to manufacture, has prolonged life span and better lighting.

Note that the points discussed below may reflect the hindsight gained from the disclosed inventions, and are not necessarily admitted to be prior art.

Being environment friendly, smaller in sizes, and longer lifetimes, and also having lower power consumption, high efficiency for lighting, less heat radiation, Light emitting diodes (LEDs) lamps have been replacing filament bulbs, halogen or fluorescent lamps for general illumination indoor and outdoors. LED lamps also are especially useful in large screen displays, back light for liquid crystal displays (LCD), the indication lights for electronic apparatus, traffic signal lights, decoration lights or illuminators.

To be more robotic and easy to use, LED packages have been developed so that they can be directly plugged into an existing socket intended to receive a conventional filament light bulb.

Figure 1A:
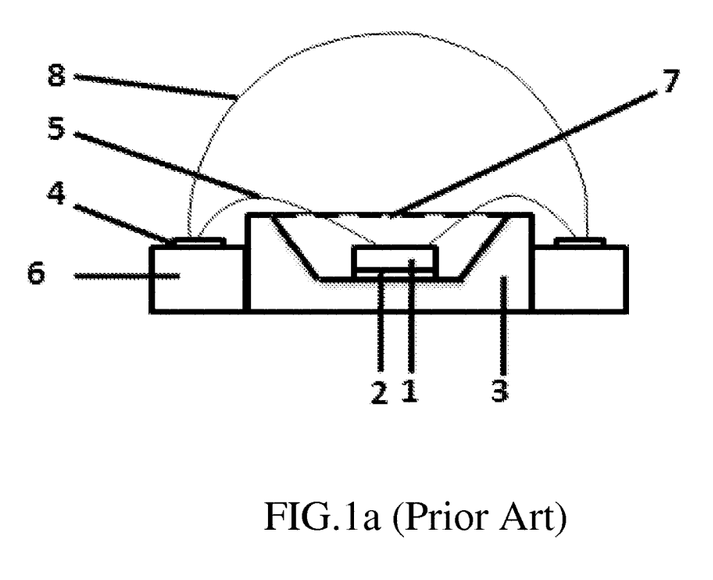
FIG. 1a is a schematic structure of a conventional LED package.

A typical LED package structure is the "spot" type as shown in FIG. 1. This package structure includes, from bottom up, a metal substrate-electrical insulator layer or adhesive layer, LED chip layer with reflect cups, electrode layer for wire connection, and a epoxy or silicone gel lens with phosphor layer inside. In FIG. 1a, a typical LED package shows to include an LED chip 1, an adhesive layer 2, a substrate 3, an electrode layer 4, an electrode wire 5, a base frame 6, a phosphor layer 7 and transparency lens 8.

Generally, to increase the light output efficiency from LED chip 1, the back side of substrate 3 may be configured as a heat sink, and the surface of substrate 3 may be configured as a reflective cup, and LED chip 1 is then mounted on substrate 3 by using insulate adhesive gel 2, which is usually silver paste or transparent insulating paste. LED chip 1 is connected with the electrode layer 4 by Au or Al wire 5, and the electrode layer 4 and the LED circuit 1 is then set on base frame 6.

A phosphor mixed silicone gel may be used between LED chip 1 and the reflection cup of substrate 3, forming emission layer 7. Epoxy or silicone may be injected onto phosphor layer 7 and covers substrate 3, LED chip 1 and wires 5, forming optical lens 8.

During the packaging process, insulator material (silver past or transparent insulating paste) as the adhesive layer is dropped onto substrate 3; then LED chip 1 is attached on substrate 3 by die bonding. The electrodes 4 in LED PN junction pad and the circuit board are connected by wire bonding. Then transparent epoxy or silicone gel is dropped to the surface of packaged LED unit, forming optical lens 8 on the LED chip surface (encapsulating). Lens 8 conducts light from the chip to the air as well as isolates the chip from the air. In a white LED, a phosphor layer may be coated onto the LED chip surface before the transparency epoxy or silicone lens is formed.

Figure 1B:
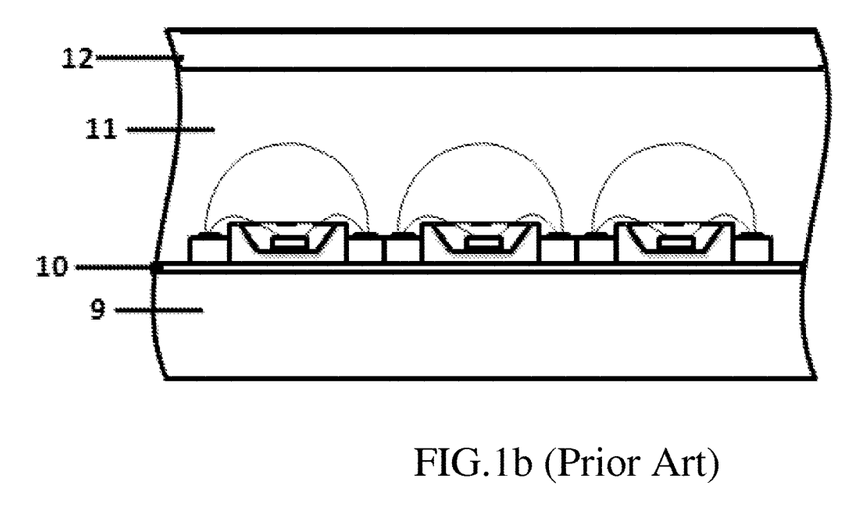
FIG. 1b is a schematic structure of a conventional LED lamp module.

This typical LED package structure and packaging process is widely used, and a single LED package can generate 0.05-5 W power depending on the chip size. Many LED units are usually arrayed together on a printed circuit board (PCB) to form a lamp module, and making a lamp, as shown in FIG. 1b.

The multiple packaged LEDs are mounted to a PCB substrate 9 by a thermal conductive adhesive layer 10. Due to such "spot" light from each LEDs, the emitted light distribution is not uniform. In practical application, a diffuser transparent plate 12 is normally used by controlling the distance 11 between the plate and LEDs to obtain a uniform illumination.

This typical LED package structure sees challenges in increasing illumination efficiency, being cost effective in manufacturing.

The thermal conductive efficiency of silver paste or transparent insulating paste is about 1-5 W/m·K, the heat generated from the LED chip therefore cannot be dissipated sufficiently quickly through such material, and causing elevated temperature of the chip, which in turn will decrease the light emission efficiency and shorten the life time of the LED, or even cause LED failure. The several intermediate layers that consist of insulator materials such as epoxy insulator, Ag paste, transparent gel, between the LED chip and the substrate, are thermal resistance materials that also contribute to the poor heat dissipation.

The "spot" structure generates high light intensity around the center of the LED chip and lens, weaker light intensity around the edges, thus producing a "glazing" effect which can be harmful to the eyes. For an LED lamp that has many arrayed LED package units, the distribution of light will not be uniform. In order to achieve uniform light distribution, usually a diffuser film or structure of certain thickness is used above the LEDs, however, resulting in decreased light efficiency.

Moreover, the epoxy or silicone gel lens which seals the LED chip from moist and dust, generally has poor thermal conductivity, the heat generated from the chip is mainly dissipated through the backside to the substrate.

The reflect layer generally uses metals such as Ag, Al thin films, the fabrication process involves sophisticated vacuum or chemical deposition which is highly costly.

Further, for "spot" structure LED lamp fabrication, multiple steps are involved. LED chips are first packaged as "spot" tube with the electrodes and lens; then the package LED tubes are arrayed by connecting in parallel or series and mounting on a PCB; a diffuser layer is then placed on top of the LED lenses; finally power supply and driver are connected.

This process is relatively complex and time consuming, and needs significant man power in the production line.

To overcome some of the above mentioned problems, a highly thermal conductive materials and transparency material with refraction index changing is described in USPTO Patent Application 2009/0026484 and a flat type LED using high thermal conductive substrate is described in USPTO Application No. 2009/0010009.

SUMMARY

The present application discloses new approaches to LED package structure and fabrication process.

It is therefore an aspect to provide a high thermal conductive insulator composite material used between the chip and the substrate for LED package.

It is therefore another aspect to provide a thermal conductive transparent material to encapsulate the chip and the substrate for LED package. The material may form a light conductive or a diffuser layer for uniform light distribution from the LED chips, converting the multi-spot light into area light. The refraction index of the material is higher than that of conventional epoxy or silicone gel so that the total internal reflection angle is widened and the light emitting efficiency is thus enhanced.

It is therefore another aspect to provide a highly reflective composite material having reflective particles to coat onto the substrate for LED package. By changing the particle size in the composite, the wave-length of the reflected light can be selected, and the reflection efficiency may reach above 95%.

In one embodiment, the LED lamp module device includes a high thermal conductive substrate, high thermal conductive insulator layers, patterned electrode circuit layer, a high reflective layer, multiple LED chips, a transparent light conducting and or diffusing layer and a light emission layer.

The high thermal conductive substrate material may comprise Al alloy, Cu alloy, carbon based composites such as graphite, carbon fiber or tubes, diamonds, carbon-metals, and ceramic composite materials such as SiC, AlN, BN which also contain metals such as Al, Cu.

The high thermal conductive insulator composite materials may include an epoxy resin or a silicone resin that are mixed with diamond, AlN, and/or BN.

In one embodiment, a conductive layer including Ag, Au, Cu, Ni, Sn, In and/or their alloys, may be formed onto the insulator layer by screen print, magnetron sputtering, or chemical deposition process. The circuit pattern may be formed by etching process or screen printing process to connect with the multiple LED chips. I In one embodiment, a high reflective composite material layer is formed onto the substrate, except the chip bonding area and wire bonding electrode pad area. A thermal conductive transparent material layer may be formed on top of the whole package array and seal the array. The layer may comprise diamond, TiO2, SiO2, MgO micro-particles mixture with silicone gel that has high quality in light conducting or diffusing for uniform lighting as well as good thermal dissipating quality.

Thus the present application, in various embodiments may provide various advantages. The high thermal conductive materials with less intermediate layers for dissipating heat from the LED chips will prevent the LED PN junction overheat, increasing the stability and reliability of the LED lamp. With high reflective composite film, the light flux from chip will be greatly enhanced, and the flat thin packaging structure is cost effective for automatic fabrication.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to presently preferred embodiments (by way of example, and not of limitation). The present application describes several embodiments, and none of the statements below should be taken as limiting the claims generally.

For simplicity and clarity of illustration, the drawing figures illustrate the general manner of construction, and description and details of well-known features and techniques may be omitted to avoid unnecessarily obscuring the invention. Additionally, elements in the drawing figures are not necessarily drawn to scale, some areas or elements may be expanded to help improve understanding of embodiments of the invention.

The terms "first," "second," "third," "fourth," and the like in the description and the claims, if any, may be used for distinguishing between similar elements and not necessarily for describing a particular sequential or chronological order. It is to be understood that the terms so used are interchangeable. Furthermore, the terms "comprise," "include," "have," and any variations thereof, are intended to cover non-exclusive inclusions, such that a process, method, article, apparatus, or composition that comprises a list of elements, and not necessarily limited to those elements, but may include other elements not expressly listed or inherent to such process, method, article, apparatus, or composition.

It is contemplated and intended that the design apply to single LED package as well as LED package arrays; for clarity reason, the examples are given based on LED lamp module, but an ordinary person in the art would know the variations to modify the design to make the design to be adapted to other suitable applications.

For the conventional LED lamp module as shown in FIGS. 1a and 1b, there are at least three layers (layers 2, 3, 10) between LED chip and PCB substrate 9, which creates thermal resistance, and affects reliability and efficiency. Often a diffuser plate 12 either in glass or polycarbonate is used in the front cover of the lamp, further reducing the light efficiency at least 10% by absorption and reflection. The added intermediate layers also increase the thickness of the lamp module.

Figure 2:
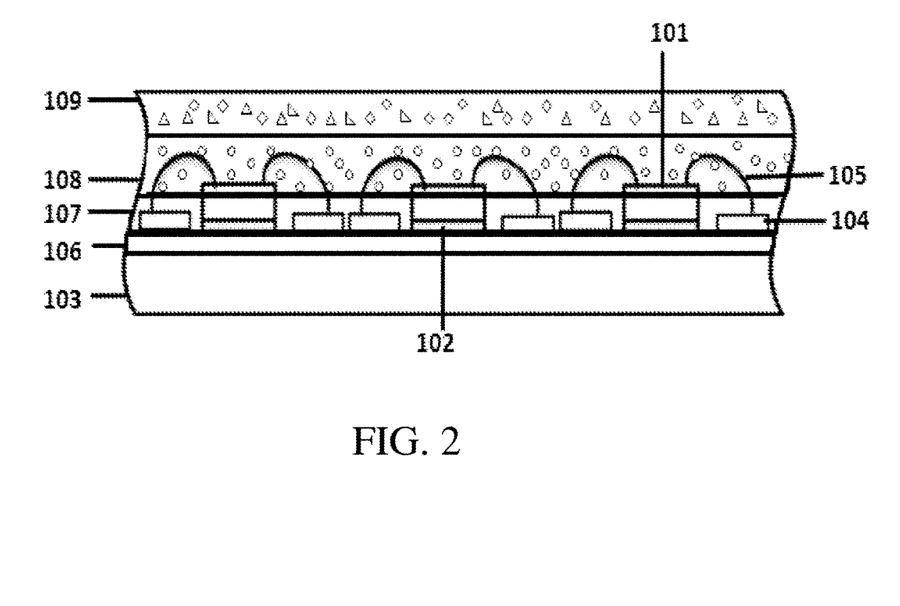
FIG. 2 is a schematic structure of a LED lamp module of a first embodiment in accordance with the present disclosure.

The present disclosure presents a new LED package structure that is both cost effective and with high lighting efficiency. FIG. 2 illustrates a structure view of a flat panel LED source of an embodiment in accordance with the present disclosure. LED chips 101 are mounted on high thermal conductive substrate 103 via a high thermal conductive adhesive layer 102 and layer 106 by die bonding. LED chip electrodes are connected with circuit electrodes 104 by Au, Cu or Al wires 105 via wire bonding process.

A flat, thin, high reflective layer 107 is then placed onto the surface of the PCB, sufficiently to cover the whole PCB but leave the LED chips exposed. The reflection efficiency of this layer may be configured to be above 95% in the visible light range (400-700 nm), the thickness may range from 10 μm to 50 μm.

The LED package array is then encapsulated with a flat diffuser layer 108. A further emission layer 109 may be placed on top of layer 108. The refraction indexes of layer 108 and 109 may be adjusted to between 2.6 and 1.2, reducing the internal light reflection. For a white LED module, the layer 109 is a phosphor conversion layer which can absorb the light from LED chips and emit white light.

For high thermal conductive substrate 103, Al alloy, Cu alloy, carbon-carbon composite materials including carbon fiber, nanotube, diamond, graphite and graphene, and ceramic (AlN, BN, SiC) composite materials may be used, where their thermal conductivity is not less than 200 W/mK. The thickness of the substrate may ranges between 0.5 to 5 mm.

For adhesive layer 102, an epoxy resin, a silicone resin or poly carbonate glue mixed with carbon and/or ceramic, such as diamond, AlN, BN, SiC, BC4, or metal micro particles including Sn, In, Ag, Au, Cu, or related alloys, may be used. For less than 500 μm LED chips, carbon or ceramic glue may be preferred in bonding the LED chips and insulating substrate 103. The thermal conductivity of such glue is usually not less than 20 W/mK. The thickness of layer 201 may range from 1 to 10 μm.

For above 500 μm LED chips, metal micro particles containing organic gel may be used as layer 102 in bonding the chips to the substrate. The organic content can be evaporated with heat treatment and the LED chip and substrate are then directly soldered together, increasing the efficiency of heat dissipation to the substrate. The thermal conductivity lay 102 may not be less than 50 W/mK. The thickness may be configured in the range of 1 to 10 μm.

On top the substrate 103, may be coated with an electric insulation layer 106. For layer 106 to be highly thermal conductive, carbon and/or ceramic composites containing diamond, AlN, BN, SiC, of which the electrical resistance is above $10^{13}$ Ωcm and the thermal conductivity is not less than 100 W/mK, may be used. The thickness of layer 106 may be in the range of 20 to 100 μm.

Because all layers (102, 103, 106) extending from the LED chips are comprised of high thermal conductive materials, the heat dissipation efficiency is greatly improved, the risk of the PN junction of the LED chip being overheated is reduced, therefore reliability of the LED lamp module is improved.

The electrical conductive layer 104 comprising Cu, Ag, Au, Ni, Sn, In, and/or related alloy film, may be deposited using magnetron sputtering, e-beam evaporation, electrochemical deposition, or screen printing. The thickness may range from 1 to 20 μm.

After the attachment of the LED chips, a high reflective material (layer 107) may be deposited via dropping or screen printing process, to cover and insulate the substrate and the electrical conductive layer 104. Layer 107 may be inorganic-organic composite contained oxide micro particles, for example, $TiO_2$, MgO, ZnO, $SnO_2$, $SiO_2$, $Al_2O_3$, in the size of 100-400 nm. The organic material may comprise epoxy resin, silicone resin, polycarbonate, polyvinyl acetate, polyurethane, polystyrene, and/or polyacrylate. This composition layer 107, with a thickness of 10 to 50 μm, usually generates a reflection efficiency of above 95% for the visible light (400-700 nm).

For diffusion layer 108, silicone or epoxy composites containing oxides, such as $TiO_2$, MgO, ZnO, $SnO_2$, $SiO_2$, or $Al_2O_3$, or diamond micro particles of sizes between 10 to 100 nm may be used. The ratio of the particles to silicone is preferred to be below 5% (wt). The addition of the micro particles enhances the thermal conduction efficiency at least 10% comparing to that of silicone alone. The refraction index of this layer can be configured to range from 1.2 to 2.6 by changing the concentration of the particles in the silicone.

This configurable refraction index in layer 108 provides significant advantages, for the refraction index of a LED chip 101 is normally big, for example, the refraction index of GaN chip is about 3.0 and refraction index of conventional packaging gel is usually less than 1.5. The big gap between the chip and packaging layer results in a significant internal reflection. The increases of refraction index in layer 108 widen the total internal reflection angle, thereby enhancing the light emitting efficiency of the LED lamp module.

For cover layer 109, a transparent or phosphor mixed silicone may be used. For white LED module, yellow phosphor or green and red phosphors in the content ratio is 10-80% (wt) may be mixed with silicone. The thickness of the phosphor mixed silicone layer is the range of 0.2 to 500 μm. The phosphor film can also be coated onto the surface of a glass or polycarbonate plate on the opposite side to layer 108, the film may range from 0.2 to 20 μm thick. When the phosphor layer absorbs the blue light emitted from the LED chip 101, a broad light spectrum can be exited from the phosphor, which emits as white light.

Figure 3:
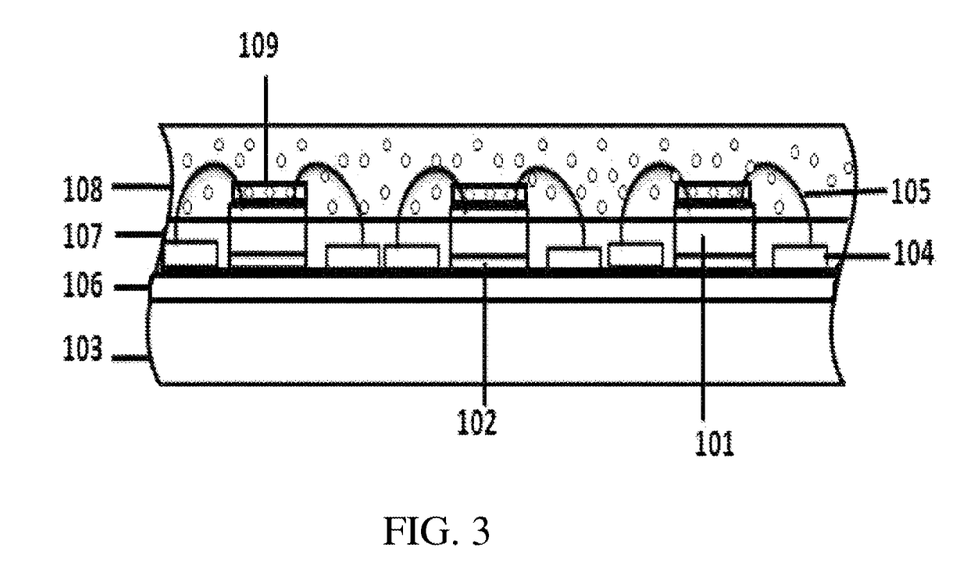
FIG. 3 is a schematic structure of a LED lamp module of a second embodiment in accordance with the present disclosure.

FIG. 3 illustrates an another embodiment in accordance with the present disclosure. In this embodiment, the phosphor layer 109 can be coated onto the surface of LED chip 101, for which the phosphor emission is more efficiency due to the shorter distance between the phosphor layer and the LED chip. The emitted light can be reflected by layer 107, and scattered (guided or diffused) by layer 108, then emitted from the surface uniformly.

Figure 4:
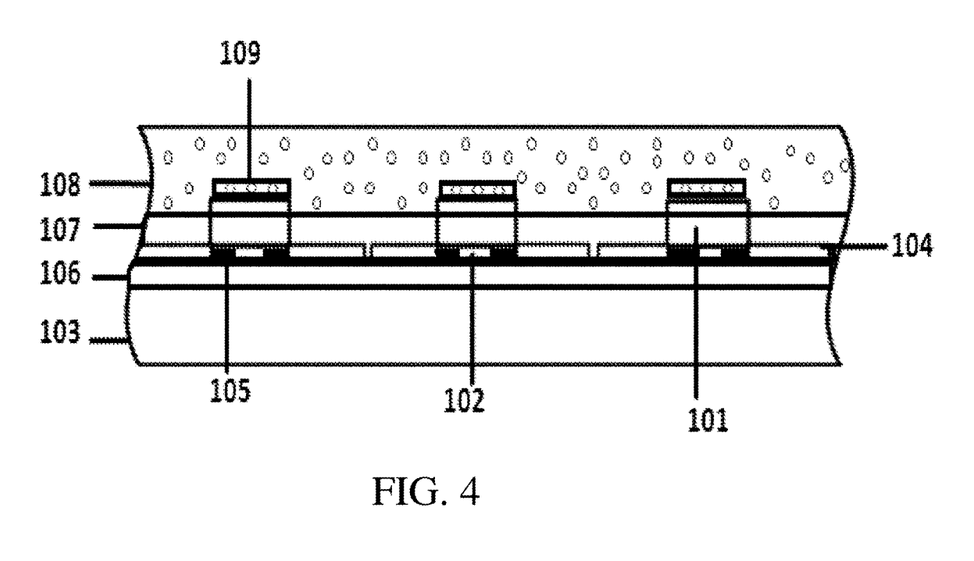
FIG. 4 is a schematic structure of a LED lamp module of a third embodiment in accordance with the present disclosure.

Further, in FIG. 4, the LED chip 101 may be mounted on the substrate through flip chip bonding technology. The electrode pads of LED chip 101 are connected with circuit electrode pads 104 by a bump structure 105.

The flat type structures of the module described above are suitable for automatic large scale production cost effectively. The produced white flat LED module may exhibit high efficiency of above 100 lm/W, and color temperature range of 3000-7000 K, color rendering index of above 75, with a uniform illumination.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

Additional general background, which helps to show variations and implementations, may be found in the following publications, all of which are hereby incorporated by reference herein for all purposes: US Patent Applications 2009/0026484, 2009/0010009; U.S. Pat. Nos. 7,259,403, 7,116,485, they are hereby incorporated by reference.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned. According to various embodiments, there is provided: a flat LED package device, comprising: a thermal conductive substrate; at least one LED chip mounted on said substrate; at least one electrical circuit pattern layered on said substrate, wherein said LED chip and said circuit are electrically connected; and a flat reflecting layer, deposited on said substrate, surrounding said LED chip.

According to various embodiments, there is provided: a flat LED lamp device, comprising: a thermal conductive substrate; plurality of LED chips mounted on said substrate, and arrayed in parallel; one or more electrical circuits layered on said substrate, and placed in between said LED chips, wherein said LED chip and said circuit are electrically connected; and a flat reflecting layer, deposited on said substrate, surrounding said LED chips.

According to various embodiments, there is provided: a method for making flat LED lamp device module, comprising the actions of the steps of: coating a thermal conductive substrate with a layer of thermal conductive and electrical insulating composite; forming circuit boards on the insulated surface of the substrate; mounting a plurality of LED chips via a layer of thermal conductive adhesive composite to the insulated surface of the substrate; electrically connecting said plurality of LED chips with at least one circuit board; depositing a flat layer of reflecting composite on the substrate surrounding the LED chips, but exposing the surfaces of the LED chips, forming a flat LED lamp package; and depositing a light conducting cover layer over the reflecting layer and the surface of the LED chips, encapsulating the surface of lamp package.

What is claimed is:

1. A flat LED package device, comprising:
   a thermal conductive substrate;
   at least one LED chip mounted on said thermal conductive substrate;
   at least one electrical circuit pattern deposited on said thermal conductive substrate horizontally placed in parallel to said at least one LED chip, wherein said at least one LED chip and said at least one circuit pattern are electrically connected; and
   a flat reflecting layer, with above 95% light reflecting rate, deposited on said thermal conductive substrate, surrounding said at least one LED chip,
      wherein said flat reflecting layer is a mixture of inorganic-organic composite containing oxide micro-particles, and organic material comprise a material selected from a group consisting of epoxy resin, silicone resin, polycarbonate, polyvinyl acetate, polyurethane, polystyrene, and polyacrylate, and said oxide microparticles are selected a group consisting of $TiO_2$, MgO, ZnO, $SnO_2$, $SiO_2$, and $Al_2O_3$, in the size of about 100-400 nm; further comprising a flat light diffusion layer over the entirety of the reflecting layer.

2. The LED package device of claim 1, wherein the flat light diffusion layer is deposited on top of said at least one LED chip, said at least one electrical circuit pattern, and said flat reflecting layer, sealing said at least one LED chip, said at least one electrical circuit pattern, and said flat reflecting layer from air.

3. The LED package device of claim 1, wherein said at least one LED chip has a first surface and a second surface wherein said first surface is attached to said thermal conductive substrate and the second surface of said at least one LED chip is coated with a layer of phosphor composite.

4. The LED package device of claim 1, further comprising a cover layer, covering and sealing said flat reflecting layer, said at least one LED chip, and said at least one electrical circuit pattern from air.

5. The LED package device of claim 1, wherein said thermal conductive substrate is coated with an insulating layer that is thermal conductive and electrical insulating; and said insulating layer is a carbon or ceramic composite containing diamond, AlN, BN, and/or SiC.

6. The LED package device of claim 1, wherein said at least one LED chip has a top surface, said flat reflecting layer also covers and seals said at least one electrical circuit pattern, but leaves said at least one LED chip's top surface exposed.

7. The LED package device of claim 1, wherein said at least one LED chip is mounted on said thermal conductive substrate via a layer of thermal conductive adhesive material.

8. The LED package device of claim 1, wherein said at least one LED chip is soldered directly on said thermal conductive substrate.

9. The LED package device of claim 1, wherein said thermal conductive substrate comprises material selected from the group consisting of Al alloys, Cu alloys, carbon-carbon composites containing carbon fibers, nanotubes, diamonds, graphites and graphenes, and ceramic composite containing AlN, BN, and/or SiC, wherein their thermal conductivity is not less than 200 W/mK, and the thickness of the thermal conductive substrate ranges between about 0.5 to about 5 mm.

10. The LED package device of claim 2, wherein said flat light diffusion layer comprises silicone or epoxy gel composites containing oxide micro-particles or diamond micro-particles, of sizes between about 10 nm to about 100 nm with a ratio of the micro-particles to silicon or epoxy gel below about 5% by weight.

11. The LED package device of claim 2, further comprising a cover layer deposited on top of said flat light diffusion layer, covering and sealing the flat light diffusion layer.

12. The LED package device of claim 11, wherein said cover layer comprises phosphor mixed silicon with phosphor to silicon ratio of about 10-80% by weight, and having a thickness in the range of about 0.2-500 μm.

13. The LED package device of claim 11, wherein said cover layer is a glass or polycarbonate plate coated with a film of phosphor composite.

14. The LED package device of claim 11, wherein at least one LED chip has a first surface and a second surface wherein said first surface is attached to said thermal conductive substrate and the second surface of said at least one LED chip is coated with a thin layer of phosphor composite.

15. The LED package device of claim 11, wherein said at least one LED chip has electrode pads, and said at least one electrical circuit pattern has electrode pads, the electrode pads of the at least one LED chip is mounted with the electrode pads of the at least one circuit pattern.

16. A flat LED lamp device, comprising:
   a thermal conductive substrate;
   a plurality of LED chips mounted on said thermal conductive substrate, and arrayed in parallel;
   one or more electrical circuits deposited on said thermal conductive substrate horizontally placed in parallel to said plurality of LED chips, and placed in between said plurality of LED chips, wherein each of said plurality of LED chips and said one or more electrical circuits are electrically connected; and
   a flat reflecting layer, with above 95% light reflecting rate, deposited on said thermal conductive substrate, surrounding each of said plurality of LED chips,
      wherein said flat reflecting layer is a mixture of inorganic-organic composite containing oxide micro-particles, and organic material comprise a material selected from a group consisting of epoxy resin, silicone resin, polycarbonate, polyvinyl acetate, polyurethane, polystyrene, and polyacrylate, and said oxide microparticles are selected a group consisting of $TiO_2$, MgO, ZnO, $SnO_2$, $SiO_2$, and $Al_2O_3$, in the size of about 100-400 nm; further comprising a flat light diffusion layer over the entirety of the reflecting layer.

17. The LED lamp device of claim 16, further wherein the flat light diffusion layer is deposited on top of said plurality of LED chips, said one or more electrical circuits, and said flat reflecting layer, sealing the plurality of LED chips, the one or more electrical circuits and the flat reflecting layer from air.

18. The LED lamp device of claim 16, wherein at least one LED chip has a first surface and a second surface wherein said first surface is attached to said thermal conductive substrate and the second surface of the at least one LED chip is coated with a layer of phosphor composite.

19. The LED lamp device of claim 16, further comprising a cover layer, covering and sealing said flat reflecting layer, said plurality of LED chips, and said one or more circuits from air.

20. The LED lamp device of claim 16, wherein said thermal conductive substrate is coated with an insulating layer that is thermal conductive and electrical insulating, and said insulating layer is a carbon or ceramic composite containing diamond, AlN, BN, and/or SiC.

21. The LED lamp device of claim 16, wherein at least one of said plurality of LED chips has a top surface, said flat reflecting layer also covers and seals said one or more electrical circuits, but leaves said at least one LED chip's top surface exposed.

22. The LED lamp device of claim 16, wherein at least one of said plurality of LED chips is mounted on said thermal conductive substrate via a layer of thermal conductive adhesive material.

23. The LED lamp device of claim 16, wherein at least one of said plurality of LED chips is soldered directly on said thermal conductive substrate.

24. The LED lamp device of claim 16, wherein said thermal conductive substrate comprises material selected from the group consisting of Al alloys, Cu alloys, carbon-carbon composites containing carbon fibers, nanotubes, diamonds, graphites and graphenes, and ceramic composites containing AlN, BN, and/or SiC, wherein their thermal conductivity is not less than 200 W/mK, and the thickness of the thermal conductive substrate ranges between about 0.5 to 5 mm.

25. The LED lamp device of claim 17, wherein said flat diffusion layer comprises silicone or epoxy gel composites containing oxide micro-particles or diamond micro-particles, of sizes between about 10 to 100 nm with the ratio of the micro-particles to silicon or epoxy gel below about 5% by weight.

26. The LED lamp device of claim 17, further comprising a cover layer deposited on top of said flat diffusion layer, covering and sealing the flat diffusion layer.

27. The LED lamp device of claim 26, wherein said cover layer comprises phosphor mixed silicon with phosphor to silicon ratio of 10-80% by weight, having a thickness in the range of about 0.2-500 μm.

28. The LED lamp device of claim 26, wherein said cover layer is a glass or polycarbonate plate coated with a film of phosphor composite.

29. The LED lamp device of claim 21, wherein the top surface of the at least one of said plurality of LED chips is coated with a layer of phosphor composite.

30. A method for making flat LED lamp device module, comprising the actions of the steps of:
   forming a coated surface on a thermal conductive substrate with a layer of thermal conductive but electrical insulating composite;
   forming a circuit board on the coated surface of the thermal conductive substrate;
   mounting a plurality of LED chips via a layer of thermal conductive adhesive composite to the coated surface of the thermal conductive substrate, wherein each of said plurality of LED chips has a top surface exposed wherein said circuit board is horizontally placed in parallel to said plurality of LED chips;
   electrically connecting said plurality of LED chips with said circuit board;
   depositing a flat layer of reflecting composite, with above 95% light reflecting rate, on the coated surface of the thermal conductive substrate, surrounding the plurality of LED chips, but exposing the top surface of each of the plurality of LED chips, forming a flat LED lamp package; and
   depositing a cover layer over the flat reflecting layer and the top surfaces of the plurality of LED chips,
      wherein said flat reflecting layer is a mixture of inorganic-organic composite containing oxide micro-particles, and organic material comprise a material selected from a group consisting of epoxy resin, silicone resin, polycarbonate, polyvinyl acetate, polyurethane, polystyrene, and polyacrylate, and said oxide microparticles are selected a group consisting of $TiO_2$, $MgO$, $ZnO$, $SnO_2$, $SiO_2$, and $Al_2O_3$, in the size of about 100-400 nm; further comprising depositing a light diffusion layer over the entirety of the reflecting layer.

31. The method of claim 30, wherein the depositing of the flat light diffusion layer comprises depositing the light diffusion layer on the top surface of the plurality of LED chips and the flat layer of reflecting composite layer before depositing the light conducting cover layer.

32. The method of claim 31, wherein said light diffusion layer comprises silicone or epoxy gel composites containing oxide micro-particles or diamond micro-particles, of sizes between about 10 to 100 nm with the ratio of the micro-particles to silicon or epoxy gel below about 5% by weight.

33. The method of claim 32, wherein the refraction index of the light diffusion layer is adjusted to between around 2.6 to around 1.2 by adjusting the sizes of the micro-particles.

34. The method of claim 30, further comprising the step of coating a phosphor composite onto the top surface of each of the plurality of LED chips.

* * * * *